(12) United States Patent
Iucolano et al.

(10) Patent No.: US 11,728,404 B2
(45) Date of Patent: Aug. 15, 2023

(54) METHOD OF MANUFACTURING A HEMT DEVICE WITH REDUCED GATE LEAKAGE CURRENT, AND HEMT DEVICE

(71) Applicant: STMICROELECTRONICS S.R.L., Agrate Brianza (IT)

(72) Inventors: Ferdinando Iucolano, Gravina di Catania (IT); Paolo Badalá, Acireale (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 69 days.

(21) Appl. No.: 17/350,916

(22) Filed: Jun. 17, 2021

(65) Prior Publication Data
US 2021/0313446 A1 Oct. 7, 2021

Related U.S. Application Data

(62) Division of application No. 16/535,016, filed on Aug. 7, 2019, now Pat. No. 11,043,574.

(30) Foreign Application Priority Data

Aug. 7, 2018 (IT) .................. 102018000007920

(51) Int. Cl.
*H01L 29/66* (2006.01)
*H01L 21/285* (2006.01)
(Continued)

(52) U.S. Cl.
CPC .. *H01L 29/66462* (2013.01); *H01L 21/28264* (2013.01); *H01L 21/28581* (2013.01);
(Continued)

(58) Field of Classification Search
CPC ......... H01L 21/28264; H01L 21/28581; H01L 21/8252; H01L 29/2003; H01L 29/205; H01L 29/41766; H01L 29/475; H01L 29/66431; H01L 29/66462; H01L 29/7786; C23C 14/0021; C23C 14/0641; C23C 14/0676; C23C 14/30
See application file for complete search history.

(56) References Cited

U.S. PATENT DOCUMENTS

| 2015/0123169 A1 | 5/2015 | Tiku et al. |
| 2017/0104083 A1 | 4/2017 | Chiu et al. |
| | (Continued) | |

FOREIGN PATENT DOCUMENTS

JP 2012-064758 A 3/2012

OTHER PUBLICATIONS

Nicolet, M.A., "Diffusion Barriers in Thin Films," *Thin Solid Films* 52, 1978, pp. 415-443.

*Primary Examiner* — Cheung Lee
(74) *Attorney, Agent, or Firm* — Seed IP Law Group LLP

(57) ABSTRACT

An HEMT device of a normally-on type, comprising a heterostructure; a dielectric layer extending over the heterostructure; and a gate electrode extending right through the dielectric layer. The gate electrode is a stack, which includes: a protection layer, which is made of a metal nitride with stuffed grain boundaries and extends over the heterostructure, and a first metal layer, which extends over the protection layer and is completely separated from the heterostructure by said protection layer.

20 Claims, 3 Drawing Sheets

(51) Int. Cl.
    *H01L 29/20*     (2006.01)
    *H01L 29/205*    (2006.01)
    *H01L 29/47*     (2006.01)
    *H01L 29/778*    (2006.01)
    *H01L 21/28*     (2006.01)
    *C23C 14/00*     (2006.01)
    *C23C 14/06*     (2006.01)
    *C23C 14/30*     (2006.01)
    *H01L 29/417*    (2006.01)

(52) U.S. Cl.
    CPC ........ *H01L 29/2003* (2013.01); *H01L 29/205* (2013.01); *H01L 29/475* (2013.01); *H01L 29/66431* (2013.01); *H01L 29/7786* (2013.01); *C23C 14/0021* (2013.01); *C23C 14/0641* (2013.01); *C23C 14/0676* (2013.01); *C23C 14/30* (2013.01); *H01L 29/41766* (2013.01)

(56) References Cited

U.S. PATENT DOCUMENTS

2017/0222032 A1*   8/2017   Liu .................... H01L 29/4966
2017/0271492 A1    9/2017   Chiu et al.
2017/0301780 A1   10/2017   Boles et al.
2019/0096879 A1*   3/2019   Chen .................. H01L 27/0629

\* cited by examiner

METHOD OF MANUFACTURING A HEMT DEVICE WITH REDUCED GATE LEAKAGE CURRENT, AND HEMT DEVICE

BACKGROUND

Technical Field

The present disclosure relates to an HEMT (high-electron-mobility transistor) device, and to a method of manufacturing the HEMT device.

Description of the Related Art

Known to the art are HEMTs based upon the formation of two-dimensional electron-gas (2DEG) layers with high mobility at a heterojunction, i.e., at the interface between semiconductor materials with different bandgaps. For instance, HEMTs are known based upon the heterojunction between a layer of aluminum gallium nitride (AlGaN) and a layer of gallium nitride (GaN).

HEMTs based upon AlGaN/GaN heterojunctions or heterostructures afford a wide range of advantages that render them particularly suited and widely used for different applications. For instance, the high breakdown threshold of HEMTs is exploited for high-performance power switches; the high electron mobility in the conductive channel enables production of high-frequency amplifiers; moreover, the high electron concentration in the 2DEG enables a low ON-state resistance (Rory) to be obtained.

In addition, GaN-based devices for RF applications typically have a better RF performance than do similar LDMOS silicon devices.

One of the important aspects of GaN-based HEMT devices, in particular in RF applications regards the gate current. This is the main cause of the current leakage that can be detected on the drain electrode when the device is in an off state. High values of leakage current considerably reduce the RF performance of the device.

The present applicant has analyzed various causes of said leakage current, basically identifying three possible paths: (a) through the surface of the heterostructure, on account of surface traps introduced during steps of surface polishing or passivation of the heterostructure; (b) between the gate electrode and the source electrode, on account of a lateral widening of the gate and source electrodes that approach one another; and (c) through the Schottky barrier, on account of a reduction of the barrier potential.

The present applicant has found that the aforementioned possible causes (a) and (b) play a role that is of no effect in the generation of the gate leakage current, whereas the cause (c) has proven the effective cause.

A known method for overcoming reduction of the barrier potential envisages the use of nickel (Ni) as metal of contact between the gate electrode and the AlGaN barrier layer of the heterostructure. Nickel is used on account of its high work function. However, nickel has a relatively high electrical resistance that does not render it suitable for forming alone the gate electrode. For this purpose, a layer of gold (Au) is used to cover the nickel and reduce the electrical resistance thereof. This approach, however, renders the manufacturing process not usable on CMOS production lines, on account of the contamination of the machinery used in the CMOS process lines caused by gold. A possible substitute of nickel to form the gate electrode is aluminum (Al), which, given its good electrical conductivity, does not need to be plated with gold; however, the work function of aluminum is low, and this choice does not prove optimal in so far as it does not enable effective reduction of the gate leakage current. Moreover, aluminum diffuses in the heterostructure, causing formation of a conductive path that favors the leakage current in the off state.

BRIEF SUMMARY

One or more embodiment of the present disclosure relate to an HEMT device with reduced gate leakage current, which can be manufactured on a CMOS production line.

According to the present disclosure, a HEMT device and a method of manufacturing the HEMT device are provided.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
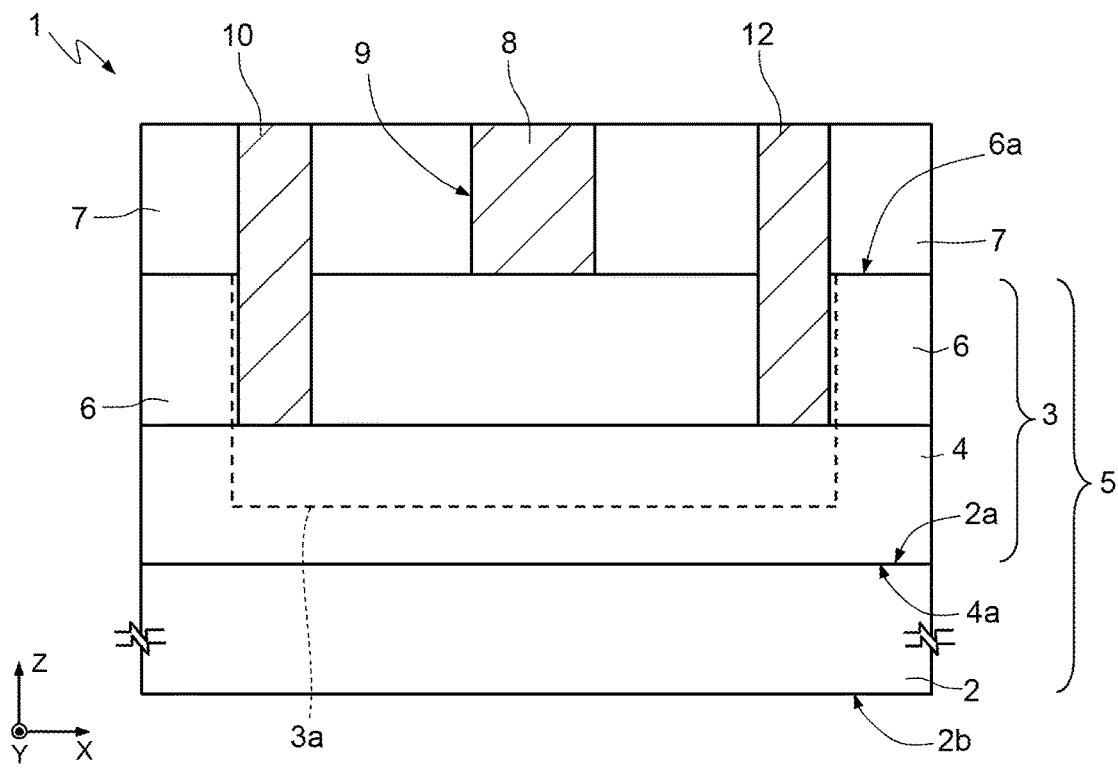
FIG. 1 is a lateral sectional view of a HEMT device according to one embodiment of the present invention.

FIG. 1 shows, in a triaxial system of mutually orthogonal axes X, Y, Z, an HEMT device 1 of a normally-on type, based upon gallium nitride. The HEMT device 1 is in particular adapted to be used in RF applications, such as 4G and 5G base stations, including evolutions and variants of said technology, portable phones, RF cooking devices, drying and heating devices, devices and systems used for avionics, L- and S-band radars, and the like.

The HEMT device 1 includes: a substrate 2, for example made of silicon, or silicon carbide (SiC), or sapphire ($Al_2O_3$); a channel layer 4, made of intrinsic gallium nitride (GaN), extending over the substrate 2; a barrier layer 6, made of intrinsic aluminum gallium nitride (AlGaN) or, more in general, of compounds with a base of ternary or quaternary alloys of gallium nitride, such as $Al_xGa_{1-x}N$, AlInGaN, $In_xGa_{1-x}N$, $Al_xIn_{1-x}Al$, which extends over the channel layer 4; an insulation layer 7, made of dielectric material such as silicon nitride ($Si_3N_4$) or silicon oxide ($SiO_2$), which extends over a top side 6a of the barrier layer 6; and a gate region (or gate-electrode region) 8, which extends in the semiconductor body 5 between a source region 10 and a drain region 12.

The channel layer 4 and the barrier layer 6 form a semiconductor heterostructure 3. The heterostructure 3 hence extends between a bottom side 4a of the channel layer 4, which is part of the interface with the underlying substrate 2, and a top side 6a of the barrier layer 6.

The substrate 2, the channel layer 4, and the barrier layer 6 are referred to, as a whole, in what follows as "semiconductor body 5". The semiconductor body 5 houses an active region 3a, which, in use, houses the conductive channel of the HEMT device 1.

The gate region 8 is separated laterally (i.e., along X) from the source region 10 and the drain region 12 by means of respective portions of the insulation layer 7. The gate region 8 is of a recess type; i.e., it extends in depth through the insulation layer 7, until it reaches the top side 6a of the barrier layer 6. In other words, the gate region 8 is formed in a trench 9 etched through the insulation layer 7. Optionally, the trench 9 extends through a part of the barrier layer 6 (for example, for a depth of 1-10 nm). The gate region 8 extends to the active region 3a.

According to further embodiments (not illustrated in so far as they do not form in themselves the subject of the present disclosure), the semiconductor body 5, as likewise the active region 3a housed thereby, may comprise, just one layer or a number layers of GaN, or GaN alloys, appropriately doped or of an intrinsic type.

The source region 10 and the drain region 12, which are made of conductive material, for example metal, extend in depth in the semiconductor body 5, right through the barrier layer 6, terminating at the interface between the barrier layer 6 and the channel layer 4.

According to further embodiments (not illustrated), the source region 10 and the drain region 12 moreover extend partially through the channel layer 4, and terminate in the channel layer 4.

According once again to further embodiments (not illustrated), the source region 10 and the drain region 12 extend for a part of the thickness, along Z, of the barrier layer 6, terminating within the barrier layer 6.

According once again to further embodiments (not illustrated), the source region 10 and the drain region 12 extend exclusively through the insulating layer 7, until they reach the surface 6a of the barrier layer 6, without sinking into the barrier layer 6.

Figure 2:
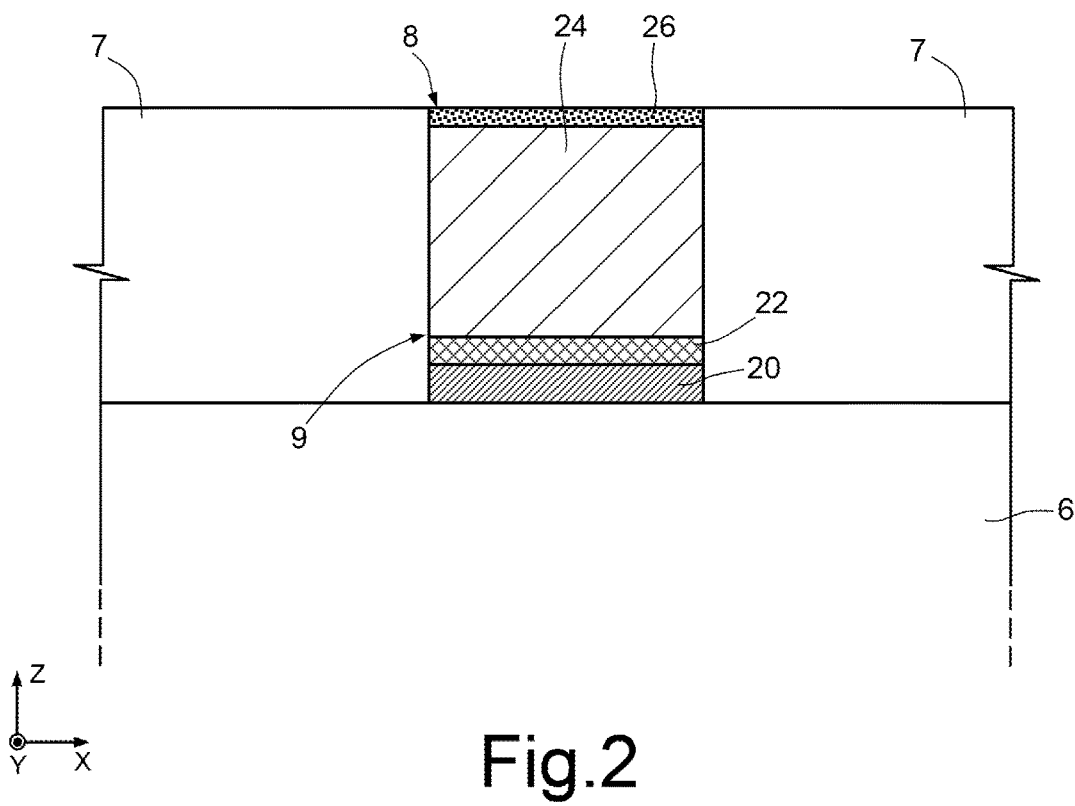
FIG. 2 illustrates, in lateral sectional view, an enlarged detail of the gate electrode of the HEMT device of FIG. 1.

According to one aspect of the present disclosure, as illustrated in FIG. 2, which represents an enlarged detail of the gate region 8 of FIG. 1, the gate region 8 is formed by a stack, which includes: a first metal layer 20, which is adapted to favor formation of a Schottky contact with the heterostructure 3 (here, in particular, with the barrier layer 6), for example a nickel (Ni) layer; a protection layer (or diffusion barrier) 22, which is adapted to hinder diffusion of metal atoms towards the heterostructure 3 and extends all over the first metal layer 20; a second metal layer 24, which is adapted to form a gate contact with reduced resistivity, extends over the protection layer 22 and is insulated from the semiconductor body 5 by means of the protection layer 22; and a cap layer 26, which adapted to protect the second metal layer 24 from external agents (e.g., protection from corrosion, oxidation, etc.).

In the case where the protection layer 22 is in itself able to favor the formation of a Schottky contact with the heterostructure 3, the first metal layer may be omitted.

In addition, in the case where the second metal layer 24 is a material not subject to degradation phenomena, or in the case where degradation phenomena are negligible, the cap layer 26 may be omitted.

In greater detail, in one embodiment of the present disclosure, the first metal layer 20 is a nickel (Ni) layer in contact with the barrier layer 6, the protection layer 22 is a tungsten-nitride (WN) layer extending over the Ni layer 20, the second metal layer is an aluminum (Al) layer 24 extending over the WN 22 layer, and the cap layer 26 is a tantalum (Ta) layer 26 extending over the Al layer 24.

The Ni layer 20, which has the function of favoring creation of a Schottky contact with the underlying barrier layer 6, may be replaced, for example, by a layer of WN, or Pt, or Pd. The Ni layer 20 has a thickness, by way of example, chosen between 20 nm and 90 nm. The Ni layer 20 may be omitted in the case of use of tungsten nitride for the protection layer 22, since the latter is able to form a good Schottky contact with the AlGaN of the barrier layer 6. In this case, the WN layer 22 is in direct contact with the barrier layer 6.

The WN layer 22 may be replaced by a different layer of metal nitride, such as tantalum nitride (TaN), titanium nitride (TiN), or titanium oxynitride (TiON), with properties of barrier in regard to diffusion of metal atoms coming from the overlying metal layer 24. The WN layer 22 has a thickness chosen, by way of example, between 20 nm and 100 nm.

The Al layer 24 has the function of improving the electrical conductivity of the gate region 8, obviating the problems of reduced electrical conductivity of the Ni layer 20. The Al layer 24 may be completely contained, or surrounded, by the WN layer 22, which insulates it from the heterostructure 3. In other words, the WN layer 22 forms a barrier against diffusion of the aluminum from the Al layer 24 towards the heterostructure 3, thus overcoming the limits of the prior art. The Al layer 24 has a thickness chosen, by way of example, between 400 nm and 800 nm. The Al layer 24 may, by way of example, be replaced by another metal layer compatible with CMOS processes.

The Ta layer 26 has the function of further protective layer, adapted to prevent phenomena of degradation, such as corrosion, oxidation, and the like. The Ta layer 26 has a thickness chosen, by way of example, between 10 nm and 50 nm. The Ta layer 26 may, by way of example, be replaced by a W layer having, by way of example, a thickness of between 10 nm and 50 nm. Alternatively, the Ta layer 26 may be omitted.

The present applicant has found that a WN or TaN layer has a crystalline structure of a so-called stuffed type, and forms an effective barrier against diffusion of atoms coming from further layers.

In layers of a polycrystalline type, the grain boundaries (i.e., the interfaces between two grains or "crystallites" of a polycrystalline material) act as diffusion paths for atoms coming from further layers in direct contact with said layers of a polycrystalline type. Formation of a protection layer effective as barrier against diffusion of undesired atoms envisages stuffing of the grain boundaries with some another material during the process of formation of the protection layer. This effect is known in the art as "grain-boundary stuffing".

The present applicant has found that a WN or TaN layer has the aforementioned characteristics of stuffed layer, in which nitrogen ($N_2$) atoms have the effect of stuffing the grain boundaries, and the material thus formed presents good barrier properties against diffusion (in particular, here, against diffusion of aluminum atoms). The present applicant has found that, one can obtain a structure of a stuffed type suitable for the purposes of the present disclosure (i.e., a layer effective as diffusion barrier), by acting appropriately on some process parameters, in particular the deposition rate, the power of the plasma source, and the flow of nitrogen introduced into the chamber during deposition, as described in detail in what follows.

Described hereinafter, with reference to FIGS. 3A-3F, are steps for manufacturing the gate region 8 of the HEMT device 1 of FIG. 1. FIGS. 3A-3F are limited to the fabrication of the gate region 8 and do not illustrate (simultaneous, previous, or subsequent) steps of formation of the source and drain terminals, electrical-contact metallizations, generic electrical connections, and any other element, in itself known, useful for operation of the HEMT device 1.

Figure 3A:
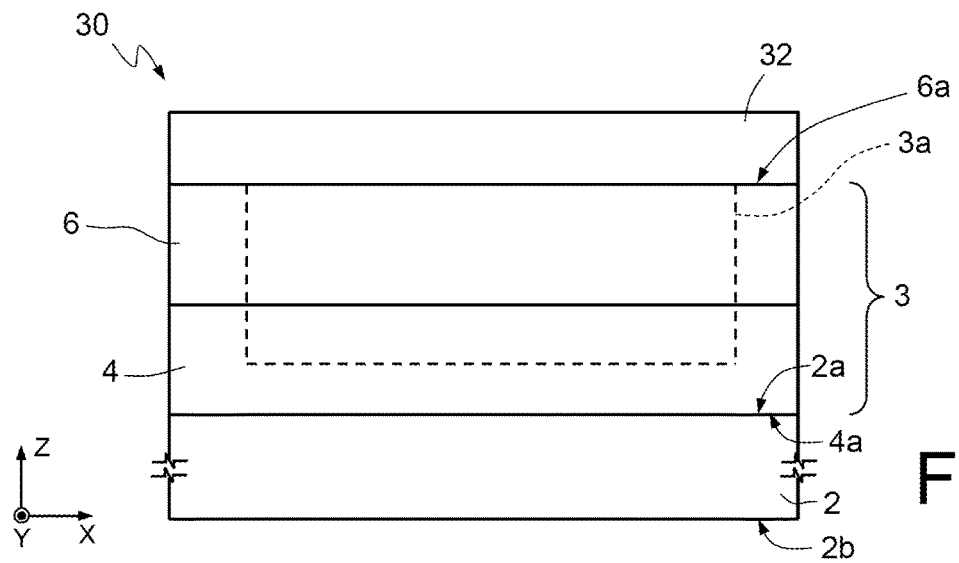
FIGS. 3A-3F show steps for manufacturing the HEMT device of FIG. 1.
Figure 3B:
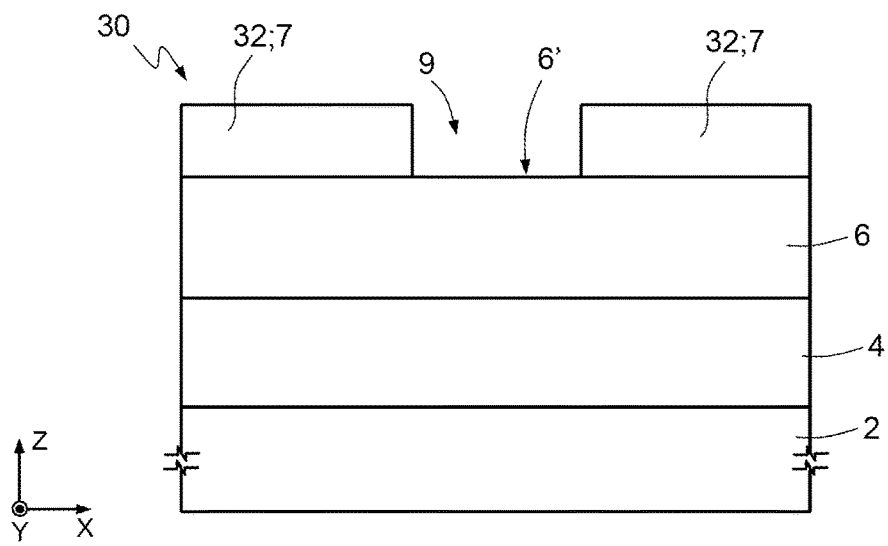
Figure 3C:
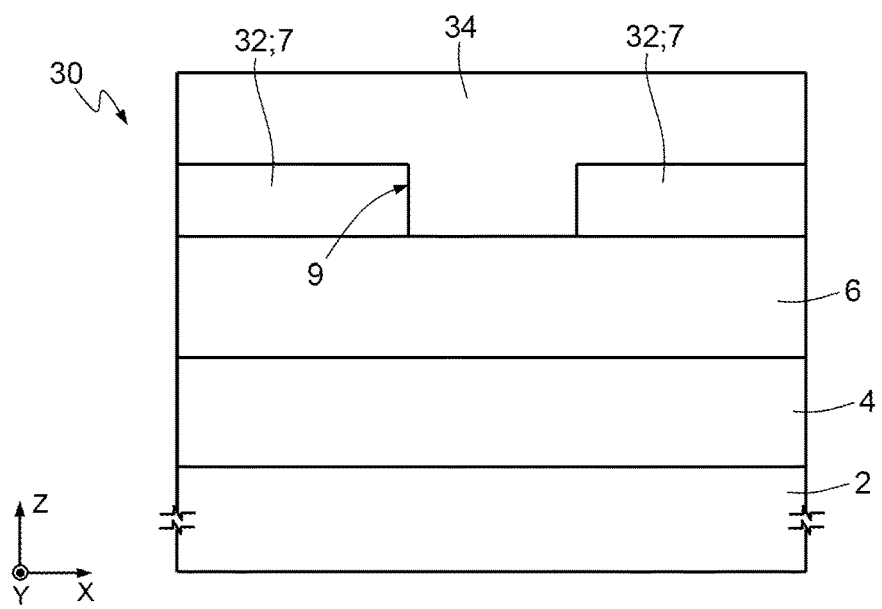
Figure 3D:
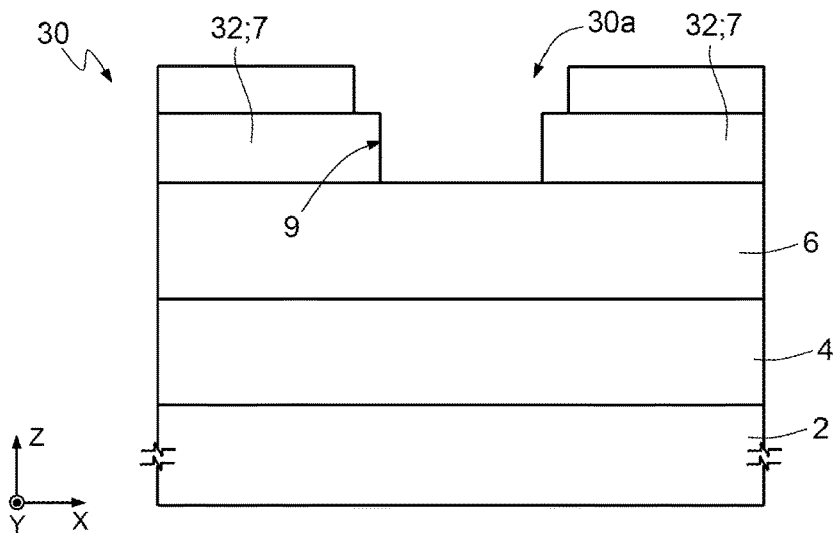
Figure 3E:
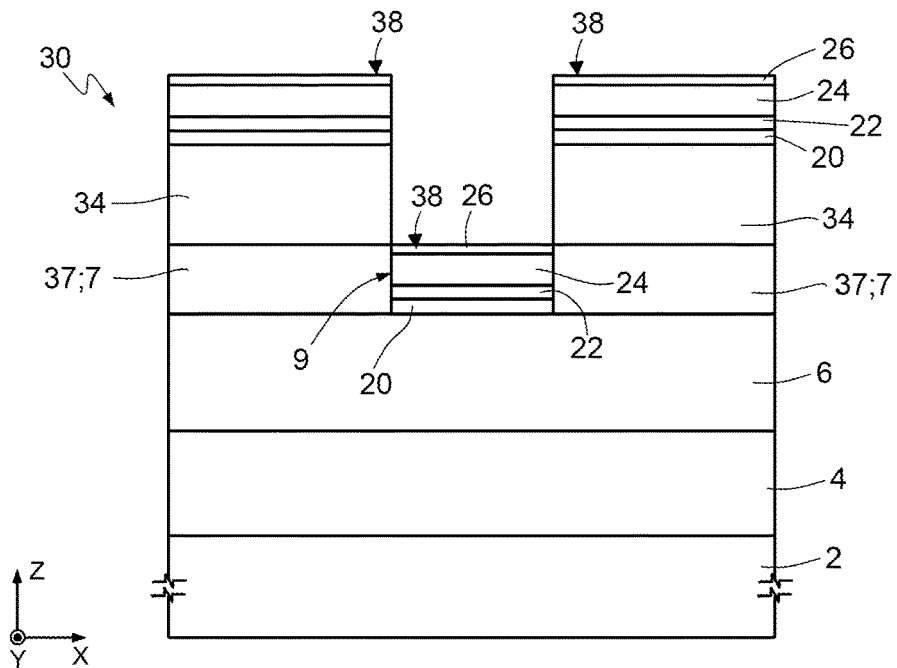
Figure 3F:
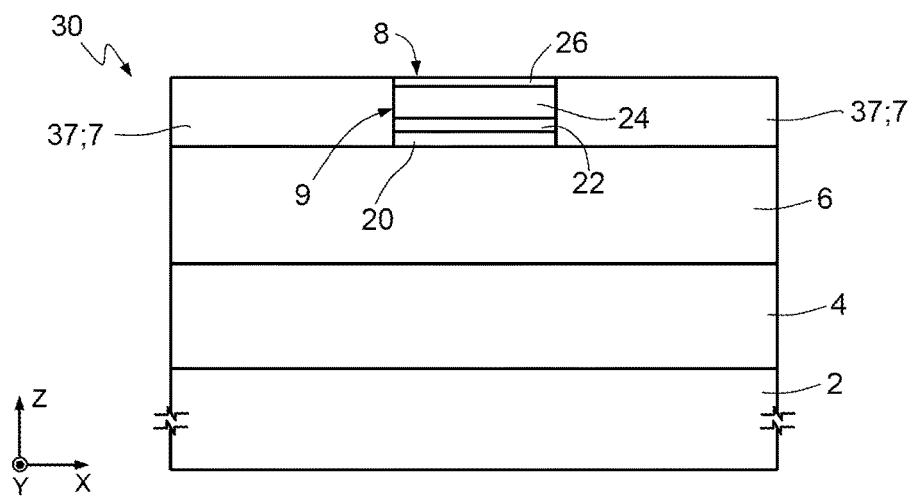

FIG. 3A shows, in lateral sectional view in the same reference system as that of FIG. 1, a portion of a wafer 30 during a step of manufacture of a HEMT device, according to one embodiment of the present disclosure. Elements of the wafer 30 common to the ones already described with reference to FIG. 1, and illustrated in said FIG. 1, are designated by the same reference numbers and are not described in detail any further.

In particular, once again with reference to FIG. 3A, the wafer 30 is provided comprising: the substrate 2, made for example of silicon (Si) or silicon carbide (SiC) or aluminum oxide ($Al_2O_3$), having a front side 2a and a back side 2b opposite to one another in a direction Z; the channel layer 4, made of gallium nitride (GaN), having its own bottom side 4a that extends adjacent to and overlapping the front side 2a of the substrate 2; and the barrier layer 6, made of aluminum gallium nitride (AlGaN), extending over the channel layer 4. The barrier layer 6 and the channel layer 4 form, as has been said, a heterostructure 3.

On the front side of the barrier layer 6 a passivation layer or a dielectric layer 32 is formed, made of dielectric or insulating material, such as silicon nitride (SiN), silicon oxide ($SiO_2$), or some other material still. The insulation layer 32 has a thickness of between 5 nm and 300 nm, for example 100 nm, and is formed by CVD (chemical-vapor deposition) or ALD (atomic-layer deposition) and, at the end of the manufacturing steps, will form the insulation layer 7 of FIG. 1.

Next (FIG. 3B), the insulation layer 32 is selectively removed, for example by means of lithographic and etching steps so as to remove selective portions thereof in the region of the wafer 30 in which, in subsequent steps, a gate region of the HEMT device is to be formed (i.e., in a region corresponding to a part of the active area 3a).

The etching step may stop at the underlying barrier layer 6, or else proceed partially within the barrier layer 6, according to respective embodiments. In both cases, a surface portion 6' of the underlying barrier layer 6 is exposed. Etching of the barrier layer 6 is, for example, carried out by dry etching. The portion of the barrier layer 6 removed generates a cavity having a depth, for example, of between 0 and 5 nm along Z.

The trench 9 is thus formed, which extends throughout the thickness of the insulation layer 32. The insulation layer 32 thus patterned corresponds to the insulation layer 7 of FIG. 1.

Then (FIG. 3C), a sacrificial layer 34 is formed on the wafer 30, in particular a layer of photoresist deposited by spin coating. The sacrificial layer 34 extends over the insulation layer 7 and within the trench 9.

Next (FIG. 3D), the sacrificial layer 34 is patterned, by means of a masked etching step, to remove selective portions of the sacrificial layer 34 within the trench 9, thus exposing it to the external environment. Following upon this step, the sacrificial layer 34 remains on the wafer 30, covering it, except for previously removed regions of the latter, which correspond, in particular, to regions 30a of the wafer 30 in which the gate region 8 is to be formed.

This is followed (FIG. 3E) by a step of deposition of conductive and barrier material on the wafer 30 to form a corresponding stack 38, in particular in order to stuff the trench 9 and form the gate region 8 of FIG. 2.

For this purpose, the process steps described in what follows are carried out. After introducing the wafer 30 into a deposition chamber by means of evaporation of a type in itself known, a process of deposition by evaporation of a nickel target is carried out, for example using an electron gun as source. The evaporation process is carried out for a time sufficient to deposit a nickel layer 20 of the desired thickness. By way of example, the pressure in the evaporation chamber is kept at a value of approximately $10^{-6}$ mbar, and the deposition rate between approximately 0.1 nm/s and 1 nm/s.

This is followed by the step of formation of the WN protection layer 22. For this purpose, a process of reactive evaporation is carried out, using a system of deposition by reactive evaporation, of a type in itself known.

For this purpose, arranged in a reactive-evaporation deposition chamber, provided with a tungsten target, is a vacuum pressure of approximately $10^{-6}$ mbar (in general, between $5 \cdot 10^{-5}$ and $10^{-7}$ mbar). Then, the tungsten target is bombarded by an electron beam (according to an evaporation process), thus generating a gas of tungsten atoms (W in the vapor phase). At the same time, in order to favor formation of tungsten nitride and hence form the protection layer 22, nitrogen ($N_2$) in the vapor phase is introduced into the same evaporation chamber, with a flow of between 10 and 30 SCCM, in particular 20-25 SCCM in the case of WN or TiN. If the flow of nitrogen introduced into the chamber is too low, the resulting diffusion-barrier layer is not completely stuffed, and hence the barrier is not effective against diffusion. If, instead, the flow is too high, the resulting diffusion-barrier layer could have an excessively high resistivity value.

To enable the reaction between nitrogen and tungsten in the vapor phase, a plasma is generated by radiofrequency, which ionizes the nitrogen gas. The power of generation of the plasma is chosen in the range between 500 W and 2500 W, in particular between 600 W and 1000 W in the case of WN or TiN. If an excessively low plasma power is used, in fact, the nitrogen is not sufficiently ionized, and the reaction with the tungsten (or with the tantalum), for formation of the corresponding nitride, does not occur in an adequate way. If the power is excessive, instead, the photoresist of the sacrificial layer 34 may damage or may even collapse, with consequent incorrect definition of the corresponding structures.

Reactive nitrogen, in the vapor phase, combines with the tungsten in the vapor phase in the deposition chamber and around the wafer 30, to form tungsten nitride. Deposition of the WN layer 22 on the wafer 30 is thus obtained. The rate of deposition of tungsten nitride by means of the method described ranges between 0.1 and 0.3 nm/s, in particular 0.1 nm/s and 0.15 nm/s in the case of WN or TiN. If the deposition rate is too high, the reaction between the two materials (in the example considered, nitrogen and tungsten, or nitrogen and tantalum) does not occur in an adequate way, on account of the excessive rate at which the material is deposited, and hence the resulting layer does not prove effective as diffusion barrier. If the deposition rate is too low, there could arise problems of stability or of low throughput.

A similar method may be used for depositing other metal nitrides, for example TaN.

The present applicant has found that, with the method described for formation of the protection layer 22, the requisites set forth previously of barrier against diffusion of atoms coming from the metal layer 24, here an aluminum layer, are satisfied.

There then follows formation of the Al layer 24 and, optionally, of the Ta layer 26, employing methods in themselves known, for example the same method described for formation of the Ni layer 20.

Finally (FIG. 3F), by means of a lift-off process of a type in itself known, the sacrificial layer 34 is removed and therewith also the portions of the stack 38 extending over the sacrificial layer 34, outside the region 30a of the wafer 30 in which the gate region 8 has formed (i.e., outside the trench 9).

It is evident that the region 30a may not coincide exactly with the trench 9, but may extend also alongside the trench 9 (in top plan view in the plane XY). In this case, in a way not represented in the figures, the gate region 8 takes on a substantially T shape in cross-sectional view in the plane XZ.

The device 1 of FIG. 2, provided with the gate region 8 illustrated in detail in FIG. 2, is thus formed.

The advantages of the disclosure according to the present disclosure emerge clearly from what has been set forth previously.

In particular, a method of manufacturing a GaN-based HEMT device for RF applications is proposed that is compatible with CMOS production lines and is free from the disadvantages linked to the gate leakage currents that may be noted in devices of a known type.

Finally, it is clear that modifications and variations may be made to what has been described and illustrated herein, without thereby departing from the sphere of protection of the present disclosure.

For instance, a stack of layers superimposed on top of one another may be present that extend between the substrate 2 and the heterostructure 3, for example that include a buffer layer and a hole-supply layer, in a way in itself known.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high electron mobility transistor (HEMT) device of a normally-on type, comprising:
    a semiconductor heterostructure;
    a dielectric layer extending over the semiconductor heterostructure and including a trench including sidewalls; and
    a gate electrode extending through the trench in the dielectric layer, wherein the gate electrode is a stack, which includes:
        a protection layer, made of a metal nitride with stuffed grain boundaries, extending over the semiconductor heterostructure;
        a first metal layer extending over the protection layer and completely separated from the semiconductor heterostructure by said protection layer;
        a second metal layer below the protection layer in contact with the semiconductor heterostructure and of a material that is able to form a Schottky junction with the semiconductor heterostructure; and
        a cap layer on the first metal layer, wherein the protection layer, the first metal layer, the second metal layer, and the cap layer are each in contact with the dielectric layer at the sidewalls of the trench.

2. The HEMT device according to claim 1, wherein the protection layer is made of a material chosen from among: tungsten nitride, tantalum nitride, titanium nitride, and titanium oxynitride.

3. The HEMT device according to claim 1, wherein the first metal layer is made of aluminum, and the protection layer is configured to form a barrier against diffusion of aluminum atoms from the first metal layer towards the semiconductor heterostructure.

4. The HEMT device according to claim 1, wherein the semiconductor heterostructure includes a semiconductor channel layer and a semiconductor barrier layer on the channel layer, the channel layer and barrier layer being made of respective compounds that include elements of Groups III and V.

5. The HEMT device according to claim 4, further comprising:
    a source electrode extending through the dielectric layer and barrier layer and contacting the channel layer; and
    a drain electrode extending through the dielectric layer and barrier layer and contacting the channel layer, the drain electrode being spaced apart from the source electrode,
    wherein the gate electrode is spaced apart from the source electrode and from the drain electrode, in direct electrical contact with the semiconductor heterostructure at an interface between the dielectric layer and the semiconductor heterostructure.

6. The HEMT device of claim 1, wherein the second metal layer includes nickel.

7. The HEMT device of claim 1, wherein the cap layer includes tantalum.

8. A high electron mobility transistor (HEMT) device of a normally-on type, comprising:
    a semiconductor substrate;
    a semiconductor heterostructure on the semiconductor substrate and including:
        a semiconductor channel layer; and
        a semiconductor barrier layer on the channel layer, the channel layer and barrier layer including elements of Groups III and V;
    a dielectric layer on the semiconductor heterostructure and including a trench having sidewalls;
    source and drain electrodes extending completely through the dielectric layer and the barrier layer and contacting the channel layer;
    a gate electrode extending through the trench in the dielectric layer and contacting the barrier layer, wherein the gate electrode includes:
        a protection layer made of a metal nitride; and
        a first metal layer on the protection layer, wherein a top surface of the gate electrode is planar with a top surface of the dielectric layer;
        a second metal layer below the protection layer in contact with the semiconductor heterostructure and of a material that is able to form a Schottky junction with the semiconductor heterostructure; and
        a cap layer on the first metal layer, wherein the protection layer, the first metal layer, the second metal layer, and the cap layer are each in contact with the dielectric layer at the sidewalls of the trench.

9. The HEMT device of claim 8, wherein the protection layer includes a material chosen from among: tungsten nitride, tantalum nitride, titanium nitride, and titanium oxynitride.

10. The HEMT device according to claim 8, wherein the first metal layer includes aluminum.

11. The HEMT device of claim 8, wherein the gate electrode is spaced apart from the source electrode and from the drain electrode and is in direct electrical contact with the semiconductor heterostructure at an interface between the dielectric layer and the semiconductor heterostructure.

12. The HEMT device of claim 8, wherein the second metal layer includes nickel.

13. The HEMT device of claim 8, wherein the cap layer includes tantalum.

14. A high electron mobility transistor (HEMT) device of a normally-on type:
- a semiconductor heterostructure;
- a dielectric layer extending over the semiconductor heterostructure and including a trench having sidewalls; and
- a gate electrode stack extending through the trench in the dielectric layer to the semiconductor heterostructure and including:
  - a protection layer of a metal nitride with stuffed grain boundaries, extending over the semiconductor heterostructure;
  - a first metal layer extending over the protection layer and completely separated from the semiconductor heterostructure by the protection layer, wherein a top surface of the gate electrode stack is planar with a top surface of the dielectric layer;
  - a second metal layer below the protection layer in contact with the semiconductor heterostructure and of a material that is able to form a Schottky junction with the semiconductor heterostructure; and
  - a cap layer on the first metal layer, wherein the protection layer, the first metal layer, the second metal layer, and the cap layer are each in contact with the dielectric layer at the sidewalls of the trench.

15. The HEMT device of claim 14 wherein the protection layer includes a material chosen from among: tungsten nitride, tantalum nitride, titanium nitride, and titanium oxynitride.

16. The HEMT device of claim 14 wherein the first metal layer includes aluminum, wherein the protection layer is a barrier against diffusion of aluminum atoms from the first metal layer towards the semiconductor heterostructure.

17. The HEMT device of claim 14 wherein the semiconductor heterostructure includes a semiconductor channel layer and a semiconductor barrier layer on the channel layer, the channel layer and barrier layer being made of respective compounds that include elements of Groups III and V.

18. The HEMT device of claim 17, further comprising:
- a source electrode extending through the dielectric layer and barrier layer and contacting the channel layer; and
- a drain electrode extending through the dielectric layer and barrier layer and contacting the channel layer, the drain electrode being spaced apart from the source electrode.

19. The HEMT device of claim 18, wherein the gate electrode stack is spaced apart from the source electrode and from the drain electrode and in direct electrical contact with the semiconductor heterostructure at an interface between the dielectric layer and the semiconductor heterostructure.

20. The HEMT device of claim 18, wherein a top surface of the cap layer, a top surface of the dielectric layer, and a top surface of the source electrode, and a top surface of the drain electrode are coplanar.

* * * * *

UNITED STATES PATENT AND TRADEMARK OFFICE
CERTIFICATE OF CORRECTION

| | | |
|---|---|---|
| PATENT NO. | : 11,728,404 B2 | Page 1 of 1 |
| APPLICATION NO. | : 17/350916 | |
| DATED | : August 15, 2023 | |
| INVENTOR(S) | : Ferdinando Iucolano et al. | |

It is certified that error appears in the above-identified patent and that said Letters Patent is hereby corrected as shown below:

In the Claims

Column 7, Claim 1, Line 59:
"first metal laver, the second metal"
Should read:
--first metal layer, the second metal--.

Signed and Sealed this
Tenth Day of October, 2023

Katherine Kelly Vidal
*Director of the United States Patent and Trademark Office*